US011175340B1

(12) United States Patent
Srivastava et al.

(10) Patent No.: US 11,175,340 B1
(45) Date of Patent: Nov. 16, 2021

(54) SYSTEM AND METHOD FOR MANAGING TESTING AND AVAILABILITY OF CRITICAL COMPONENTS ON SYSTEM-ON-CHIP

(71) Applicant: NXP B.V., Eindhoven (NL)

(72) Inventors: Neha Srivastava, New Delhi (IN); Shreya Singh, Ranchi (IN)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 17/175,950

(22) Filed: Feb. 15, 2021

(51) Int. Cl.
*G01R 31/00* (2006.01)
*G01R 31/3177* (2006.01)
*G01R 31/317* (2006.01)

(52) U.S. Cl.
CPC ... *G01R 31/3177* (2013.01); *G01R 31/31724* (2013.01)

(58) Field of Classification Search
None
See application file for complete search history.

(56) References Cited

U.S. PATENT DOCUMENTS

| 6,247,144 | B1* | 6/2001 | Macias-Garza | G06F 9/30032 714/25 |
| 7,020,803 | B2 | 3/2006 | Wolin et al. | |
| 7,085,225 | B2 | 8/2006 | Schaller et al. | |
| 7,941,722 | B2* | 5/2011 | Cussonneau | G01R 31/31703 714/742 |
| 8,049,529 | B2 | 11/2011 | Fulcomer | |
| 8,868,989 | B2 | 10/2014 | Jindal et al. | |
| 8,954,806 | B2 | 2/2015 | Dan et al. | |
| 9,336,074 | B2 | 5/2016 | Chebruch et al. | |
| 10,078,565 | B1* | 9/2018 | Petersson | G06F 11/185 |
| 10,643,011 | B1* | 5/2020 | Nardi | G06F 30/394 |
| 10,909,284 | B1* | 2/2021 | Crouch | G06F 30/392 |
| 2004/0017219 | A1* | 1/2004 | Han | G01R 31/318555 326/16 |
| 2005/0050387 | A1 | 3/2005 | Mariani et al. | |
| 2007/0204190 | A1* | 8/2007 | Hesse | G11C 29/16 714/718 |

(Continued)

OTHER PUBLICATIONS

S. Mal-Sarkar, R. Karam, S. Narasimhan, A. Ghosh, A. Krishna and S. Bhunia, "Design and Validation for FPGA Trust under Hardware Trojan Attacks," in IEEE Transactions on Multi-Scale Computing Systems, vol. 2, No. 3, pp. 186-198, Jul. 1-Sep. 2016, doi: 10.1109/TMSCS.2016.2584052. (Year: 2016).*

(Continued)

*Primary Examiner* — Daniel F. McMahon

(57) ABSTRACT

A system-on-chip (SoC) is disclosed. The SoC includes a set of fake fault injection circuits and a critical intellectual property (IP) core that includes first and second control circuits. The first and second control circuits are each operable in a test mode and a functional mode. The first and second control circuits are operated in the functional mode in lockstep in an absence of a fake fault input. In a presence of the fake fault input, one of the first and second control circuits is switched from the functional mode to the test mode. One of the first and second control circuits operating the test mode generates a fake fault response for the fake fault input. The critical IP core is determined as one of error-free and erroneous based on a detection of the generated fake fault response as one of error-free and erroneous, respectively.

20 Claims, 7 Drawing Sheets

(56) References Cited

U.S. PATENT DOCUMENTS

| | | | |
|---|---|---|---|
| 2007/0208977 A1 | 9/2007 | Clark et al. | |
| 2012/0030532 A1* | 2/2012 | Jain | G01R 31/318547 |
| | | | 714/726 |
| 2013/0145213 A1* | 6/2013 | Tang | G01R 31/31703 |
| | | | 714/33 |
| 2014/0365838 A1* | 12/2014 | Tekumalla | G01R 31/318547 |
| | | | 714/726 |
| 2019/0171536 A1* | 6/2019 | Refaeli | G06F 11/16 |
| 2019/0278677 A1* | 9/2019 | Terechko | G06F 11/2242 |
| 2020/0117554 A1* | 4/2020 | Chaudhari | G06F 11/0772 |

OTHER PUBLICATIONS

U.S. Appl. No. 16/917,663, filed Jun. 30, 2020, 36 pages.
U.S. Appl. No. 17/024,814, filed Sep. 18, 2020, 43 pages.
U.S. Appl. No. 17/024,798, filed Sep. 18, 2020, 36 pages.

\* cited by examiner

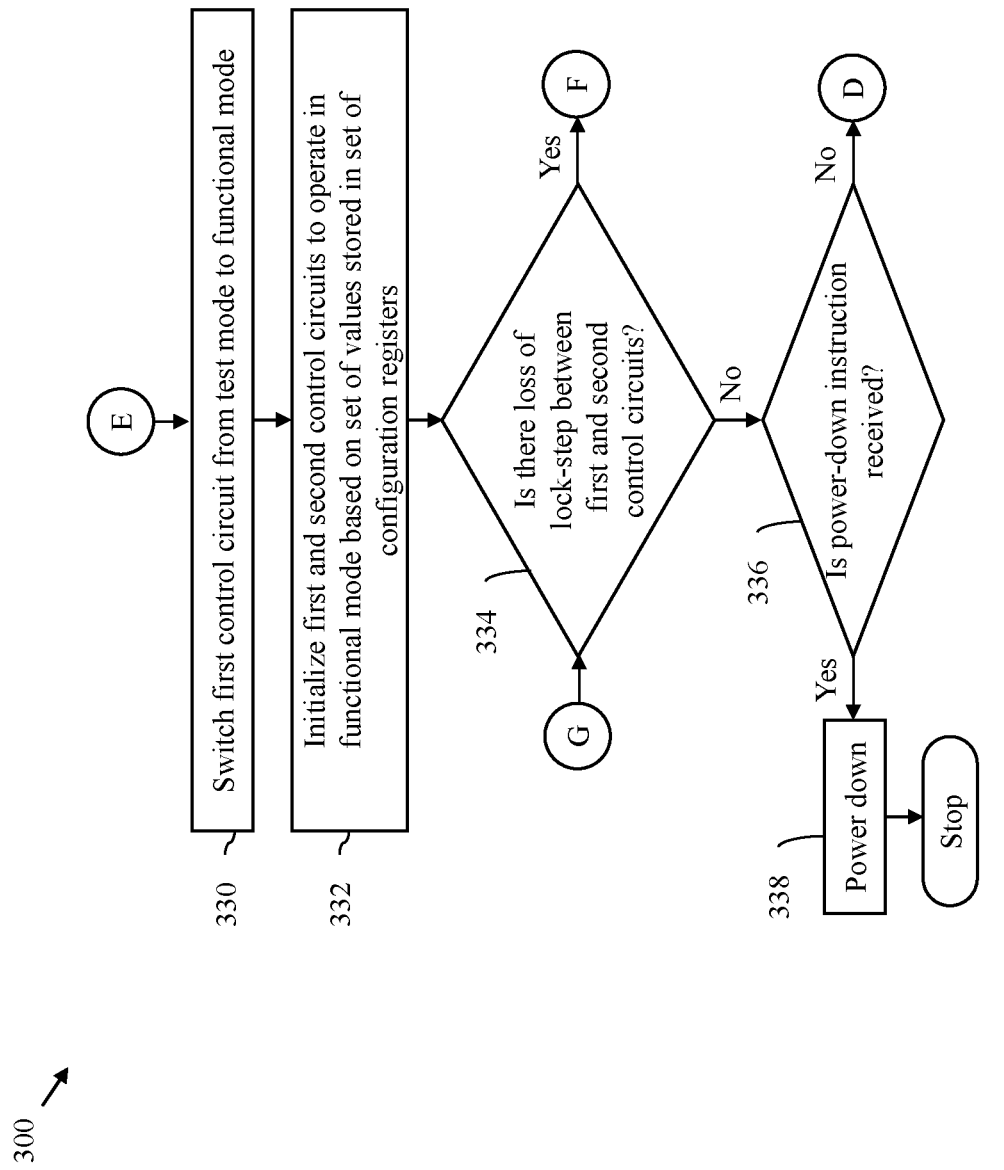

SYSTEM AND METHOD FOR MANAGING TESTING AND AVAILABILITY OF CRITICAL COMPONENTS ON SYSTEM-ON-CHIP

BACKGROUND

The present disclosure relates generally to electronic circuits, and, more particularly, to a system and a method for managing testing and availability of critical components on a system-on-chip (SoC).

A system-on-chip (SoC) includes various intellectual property (IP) cores or components for executing various functions of the SoC. The IP cores on the SoC may be subjected to testing to ensure error-free functioning of these IP cores. Testing (e.g., built-in self-test or BIST) of the IP cores typically involves injection of fake faults (i.e., inputting fake fault) into the IP cores and verifying responses of the IP cores to the injected fake faults. An IP core that is injected with a fake fault is usually rendered "unavailable" for handling actual or functional inputs, until the IP core recovers from the fake fault.

However, some of these IP cores may be classified as "critical". The critical IP cores (e.g., a reset generation circuit, a clock generation circuit, or the like) are generally required to be active during testing of other IP cores (critical or non-critical IP core) on the SoC. In other words, the critical IP cores are required to be always "available" for handling actual or functional input. Injection of fake faults into the critical IP cores may lead to loss of availability of the critical IP or the SoC as a whole. This leads to poor fault coverage of the critical IP cores, as there is no mechanism for reliably injecting fake faults into the critical IP cores.

In light of the above, there is a need for a technical solution that enhances fault coverage of critical IP cores without comprising on their availability.

SUMMARY

In one embodiment, a system-on-chip (SoC) is disclosed. The SoC can include a set of critical intellectual property (IP) cores configured to remain active for a built-in self-test of the SoC. A first critical IP core of the set of critical IP cores can include first and second control circuits, each operable in a test mode and a functional mode. The first critical IP core further can include a selection circuit coupled with the first and second control circuits, and configured to select each of the first and second control circuits to operate in one of the test mode and the functional mode. In an absence of a fake fault input, the selection circuit can be configured to select the first and second control circuits to operate in the functional mode in lock-step. In a presence of the fake fault input, the selection circuit can be configured to switch one of the first and second control circuits from the functional mode to the test mode. One of the first and second control circuits that is switched to the test mode can be configured to receive the fake fault input and generate a fake fault response for the fake fault input. The first critical IP core is determined as one of error-free and erroneous based on the generated fake fault response.

In another embodiment, a method for facilitating testing of a critical intellectual property (IP) core in a system-on-chip (SoC) is disclosed. The method can include selecting, by a selection circuit of the critical IP core, first and second control circuits of the critical IP core to operate in a functional mode in an absence of a fake fault input. Each of the first and second control circuits can operate in a test mode and the functional mode. The method can further include receiving, by an event capture and synchronizer circuit of the critical IP core, the fake fault input. The method can further include switching, by the selection circuit, the first control circuit from the functional mode to the test mode based on the received fake fault input. The method can further include generating, by the first control circuit operating in the test mode, a fake fault response for the fake fault input. The method can further include detecting, by a monitor circuit of the critical IP core, the generated fake fault response as one of error-free and erroneous. The critical IP core can be determined as one of error-free and erroneous based on the detection of the generated fake fault response as one of error-free and erroneous, respectively In some examples, when the first and second control circuits are selected to operate in the functional mode, the first and second control circuits can be configured to receive a functional input and generate corresponding first and second functional responses for the functional input.

In some examples, when the first and second control circuits are selected to operate in the test mode and the functional mode, respectively, the second control circuit can be configured to receive a functional input and generate a functional response for the functional input.

In some examples, the first critical IP core can further include a signal control circuit coupled with the first and second control circuits, and configured to receive the fake fault response and the functional response from the first and second control circuits, respectively. The signal control circuit can be further configured to mask the fake fault response from the SoC and output the functional response.

In some examples, the first critical IP core can further include an event capture and synchronizer circuit coupled with the first and second control circuits and the selection circuit, and can be configured to receive and provide the fake fault input and the functional input to the first and second control circuits, respectively, based on the selection of the first and second control circuits to operate in the test mode and the functional mode, respectively.

In some examples, the first critical IP core can further include a monitor circuit coupled with the first and second control circuits and the selection circuit, and configured to detect the generated fake fault response as one of error-free and erroneous.

In some examples, the first critical IP core can be configured to be reset based on the detection of the fake fault response as erroneous.

In some examples, the selection circuit can be further configured to switch one of the first and second control circuits that is selected to operate in the test mode to the functional mode based on the detection of the generated fake fault response as error-free. The first critical IP core can be determined as error-free based on the detection of the generated fake fault response as error-free.

In some examples, the monitor circuit can be further configured to detect whether the first and second control circuits are operating in lock-step.

In some examples, the first critical IP core can be configured to be reset, based on the detection of a loss of lock-step in the first and second control circuits.

In some examples, the first critical IP core can further include a register interface coupled with the first and second control circuits and the selection circuit. The register interface can include a set of configuration registers configured to store a set of values to initialize each of the first and second control circuits to operate in the test mode and the functional mode. The register interface can further include a set of status registers configured to store the fake fault response generated by one of the first and second control circuits that is selected to operate in the test mode.

In some examples, the SoC can further include a fault injection circuit coupled with the first critical IP core, and can be configured to generate the fake fault input and provide the generated fake fault input to the first critical IP core to test the first critical IP core.

Various embodiments of the present disclosure disclose a system-on-chip (SoC). The SoC can include a set of critical intellectual property (IP) cores configured to remain active for a built-in self-test of the SoC. A first critical IP core of the set of critical IP cores can include first and second control circuits and a selection circuit. Each of the first and second control circuits can be operable in a test mode and a functional mode. The selection circuit can be coupled with the first and second control circuits, and can be configured to select each of the first and second control circuits to operate in one of the test mode and the functional mode. In an absence of a fake fault input, the selection circuit can select the first and second control circuits to operate in the functional mode in lock-step. When the first and second control circuits are selected to operate in the functional mode, the first and second control circuits can receive a functional input and generate corresponding first and second functional responses for the functional input. In a presence of the fake fault input, the selection circuit can switch one of the first and second control circuits from the functional mode to the test mode and the other control circuit continues to operate in the functional mode. One of the first and second control circuits that is switched to the test mode can be configured to receive the fake fault input and generate a fake fault response for the fake fault input. The first critical IP core can be determined as one of error-free and erroneous based on the generated fake fault response. When the generated fake fault response is detected as error-free, the selection circuit can be further configured to switch one of the first and second control circuits that is selected to operate in the test mode to the functional mode.

Therefore, the first critical IP core achieves optimal fault coverage without compromising on the availability. The first critical IP core can include, therein, the first and second control circuits that are operable in both functional mode and the test mode. This ensures that the first critical IP core may always be available to process any fake fault input or functional input received by the first critical IP core. For example, when a fake fault input is provided to the first critical IP core, one of the first and second control circuits can be operated in the test mode, while a remaining circuit of the first and second control circuits can be operated in the functional mode. This enables testing of the first critical IP core without comprising on the availability of the first critical IP core, since at least one of the first and second control circuits is always available for processing any functional (i.e., actual) input received by the first critical IP core. A fake fault response generated, by the control circuit operating in the test mode, may be used to determine whether the first critical IP core is error-free or erroneous. Further, since there is no replication or duplication of the entire first critical IP core, impact on a die size (i.e., physical footprint) of the SoC is negligible.

BRIEF DESCRIPTION OF THE DRAWINGS

The following detailed description of the preferred embodiments of the present disclosure will be better understood when read in conjunction with the appended drawings. The present disclosure is illustrated by way of example, and not limited by the accompanying figures, in which like references indicate similar elements.

FIGS. 3A-3D, collectively represent a flow chart that illustrates a method for managing testing and availability of the first critical IP core, in accordance with an embodiment of the present disclosure.

DETAILED DESCRIPTION

The detailed description of the appended drawings is intended as a description of the currently preferred embodiments of the present disclosure, and is not intended to represent the only form in which the present disclosure may be practiced. It is to be understood that the same or equivalent functions may be accomplished by different embodiments that are intended to be encompassed within the spirit and scope of the present disclosure.

Figure 1:
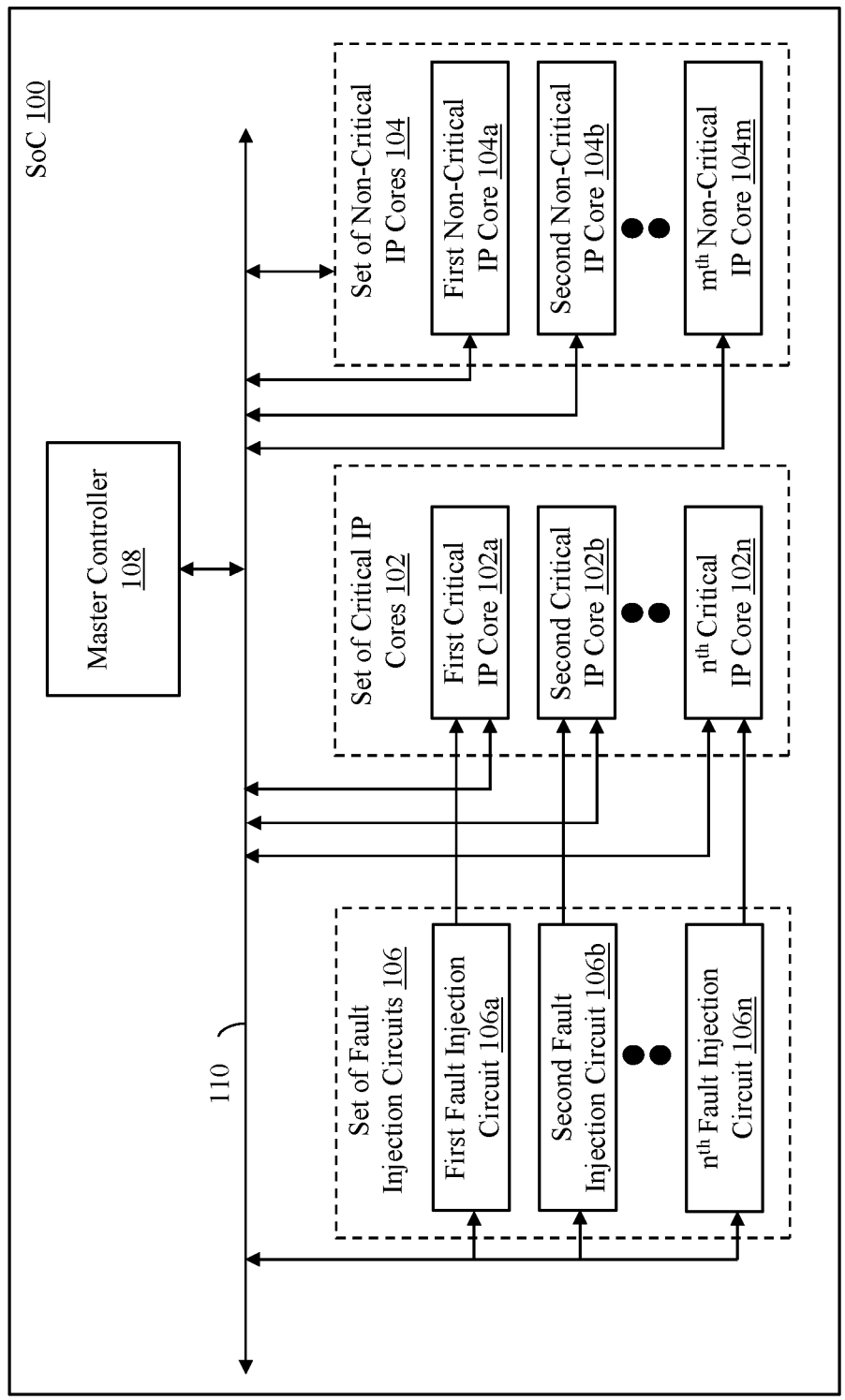
FIG. 1 is a block diagram of a system-on-chip (SoC), in accordance with an embodiment of the present disclosure.

FIG. 1 is a block diagram of a system-on-chip (SoC) 100, in accordance with an embodiment of the present disclosure. The SoC 100 can be a multi-core SoC that may be used in various application areas such as, but not limited to, automotive safety, image processing, video processing, networking, consumer electronics, manufacturing, or the like. For example, the SoC 100 may be used in anti-lock braking systems, autonomous driving systems, adaptive cruise control systems, intelligent torque vectoring systems, or the like. The SoC 100 is shown to include a set of critical intellectual property (IP) cores 102, a set of non-critical IP cores 104, a set of fault injection circuits 106, and a master controller 108. The set of critical IP cores 102, the set of non-critical IP cores 104, the set of fault injection circuits 106, and the master controller 108 can be configured to communicate with each other by way of a system bus 110.

The set of critical IP cores 102 can include those IP cores of the SoC 100 that are required to be active during a logical built-in self-test (LBIST) of the SoC 100. For LBIST, software and/or hardware can be inbuilt or embedded in the SoC 100, enabling scanning of the IP cores (e.g., the set of critical IP cores 102) for faults and determining a level fault coverage for each IP core. Testing techniques such as LBIST, memory BIST, or automatic test pattern generation are well known to those of skill in the art. Examples of the set of critical IP cores 102 may include, but are not limited to, a reset generation core (i.e., reset controller), a clock generation core (i.e., clock generation circuit), a phase locked loop (PLL) core, or the like. The set of critical IP cores 102 is shown to include first through $n^{th}$ critical IP cores 102a-102n. Various components of a critical IP core (e.g., any of the set of critical IP cores 102) and corresponding operations are described in conjunction with FIGS. 2A and 2B.

The set of non-critical IP cores 104 can include those IP cores of the SoC 100 that are not required to be active during an LBIST of the SoC 100. Examples of the set of non-critical IP cores 104 may include, but are not limited to, a peripheral component interconnect express (PCIe) core, a fault collection and control unit, or the like. The set of non-critical IP cores 104 is shown to include first through $m^{th}$ non-critical IP cores 104.

The set of fault injection circuits 106 can include circuits that that are configured to inject fake faults into or provide fake faults to the set of critical IP cores 102 or the set of non-critical IP cores 104. A fake fault input may be defined as a spurious event or input that is provided to a component (e.g., a critical IP core or a non-critical IP core) to verify an integrity of the component. A response generated by the component for the fake fault can be compared with a known or expected response to determine whether the component is erroneous or error free (i.e., to determine whether the integrity of the component is compromised or not).

The set of fault injection circuits 106 is shown to include first through $n^{th}$ fault injection circuits 106a-106n. Each of the first through $n^{th}$ fault injection circuits 106a-106n can be coupled with a corresponding critical IP core of the set of critical IP cores 102. For example, the first fault injection circuit 106a is coupled with the first critical IP core 102a. Similarly, the $n^{th}$ fault injection circuit 106n is coupled with the $n^{th}$ critical IP core 102n. For the sake of brevity, each critical IP core is shown to be coupled with a separate fault injection circuit. However, in another embodiment, multiple critical IP cores may be coupled with a single fault injection circuit. In some embodiments, a fault injection circuit, of the set of fault injection circuits 106, may inject a set of fake faults into a corresponding critical IP core, of the set of critical IP cores 102, when the SoC 100 is powering up.

The master controller 108 can include suitable logic, circuitry, and/or interface that can be configured to perform various operations. In one embodiment, the master controller 108 may be configured to communicate fault injection requests to the set of fault injection circuits 106 (e.g., the first fault injection circuit 106a), to inject or input fake faults into the set of critical IP cores 102 (e.g., the first critical IP core 102a). The fault injection requests may be indicative of a type of fault to be injected or inputted into each of the set of critical IP cores 102. In some embodiments, the master controller 108 can be configured to communicate the fault injection requests to the set of fault injection circuits 106 at periodic time-intervals, enabling periodic testing of the set of critical IP cores 102. In some embodiments, the master controller 108 may communicate the fault injection requests to the set of fault injection circuits 106 on occurrence of a specific event (e.g., a hardware trigger or a software trigger).

Figure 2A:
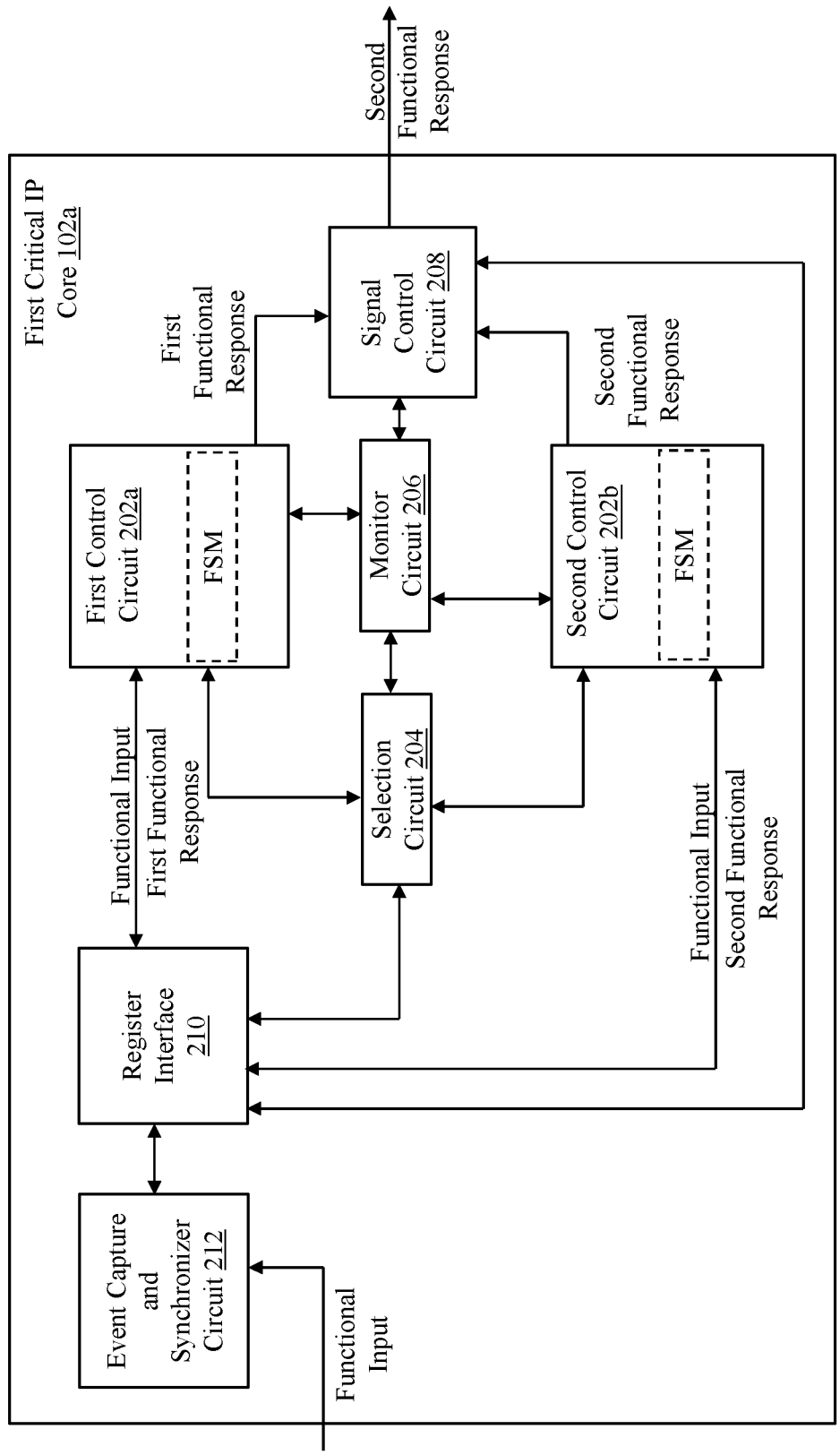
FIG. 2A is a block diagram that illustrates a first critical IP core of FIG. 1, in accordance with an embodiment of the present disclosure.

FIG. 2A is a block diagram that illustrates a critical IP core of the set of critical IP cores 102, in accordance with an embodiment of the present disclosure. The critical IP core illustrated in FIG. 2A can be any of the first through $n^{th}$ critical IP cores 102a-102n, without deviating from the scope of the disclosure. In a non-limiting example, the critical IP core illustrated in FIG. 2A is assumed to be the first critical IP core 102a. The first critical IP core 102a can include first and second control circuits 202a and 202b, a selection circuit 204, a monitor circuit 206, and a signal control circuit 208. The first critical IP core 102a can further include a register interface 210 and an event capture and synchronizer circuit 212.

The first control circuit 202a can include suitable logic and circuitry that can be configured to perform one or more operations for implementing a core logic of the first critical IP core 102a. The first control circuit 202a can be configured to receive inputs (e.g., fake fault inputs or functional inputs), process the received inputs, and generate corresponding responses. For generating the responses to the received inputs, the first control circuit 202a can be configured to implement a finite state machine (FSM). The FSM can define the core logic and a functioning of the first critical IP core 102a. The FSM implemented by the first control circuit 202a can define responses to be generated by the first control circuit 202a for various types of inputs. The second control circuit 202b can be a duplicate or redundant instance of the first control circuit 202a. Similar to the first control circuit 202a, the second control circuit 202b can be configured to implement the FSM (i.e., a duplicate FSM) for generating responses to the received inputs. Each of the first and second control circuits 202a and 202b is operable (i.e., can be operated) in two modes—a test mode and a functional mode.

When operating in the test mode, a control circuit (e.g., the first control circuit 202a or the second control circuit 202b) can be configured to receive a fake fault input. The fake fault input may be a spurious input injected by a fake fault injection circuit (e.g., the first fault injection circuit 106a) into the first critical IP core 102a for verifying or validating a functioning of the first critical IP core 102a (i.e., for determining whether the first critical IP core 102a is erroneous or error-free). Based on the fake fault input, the control circuit (e.g., the first control circuit 202a or the second control circuit 202b) can be configured to generate a fake fault response. If the fake fault response generated for the fake fault input is erroneous, the first critical IP core 102a can be determined as erroneous. If the fake fault response generated for the fake fault input is error-free, the first critical IP core 102a can be determined as error-free. In other words, the first critical IP core 102a can be determined as one of error-free or erroneous, based on the generated fake fault response.

When operating in the functional mode, a control circuit (e.g., the first control circuit 202a or the second control circuit 202b) can be configured to receive a functional or actual input. The functional input may be any input provided to the first critical IP core 102a for a purpose of processing (i.e., handling). In one embodiment, the functional input may be any non-fake fault input provided to or injected into the first critical IP core 102a. For example, functional input may be a real-time input (e.g., an interrupt or a real-time fault) received, by the first critical IP core 102a, from the master controller 108a or any of the set of non-critical IP cores 104 for a purpose of processing by the first critical IP core 102a. Based on the received functional input, the control circuit (e.g., the first control circuit 202a or the second control circuit 202b) operating in the functional mode can be configured to generate a functional response for the functional input.

The selection circuit 204 can be coupled with the first and second control circuits 202a and 202b, and can include suitable logic and circuitry for selecting a mode of operation for each of the first and second control circuits 202a and 202b. In other words, the selection circuit 204 can be configured to select each of the first and second control circuits 202a and 202b to operate in one of the functional mode and the test mode. The selection circuit 204 can be configured to communicate (i.e., provide), to the first and second control circuits 202a and 202b, inputs (e.g., fake fault inputs and functional inputs) received by the first critical IP core 102a. In an event that a fake fault input is received by the first critical IP core 102a (i.e., in a presence of a fake fault input), the selection circuit 204 can be configured to select one of the first and second control circuits 202a and 202b to operate in the test mode and a remaining control circuit of the first and second control circuits 202a and 202b to operate in the functional mode, thereby managing testing and availability of the first critical IP core 102a, simultaneously. In one example, the selection circuit 204 selects the first control circuit 202a for operating in the test mode. In such a scenario, the second control circuit 202b can be configured to operate in the functional mode. In an alternate example, the selection circuit 204 selects the second control circuit 202b for operating in the test mode. In such a scenario, the first control circuit 202a can be configured to operate in the functional mode.

The selection circuit 204 can be further configured to communicate, to the control circuit (e.g., the first control circuit 202a or the second control circuit 202b) that is selected to operate in the test mode, the fake fault input received by the first critical IP core 102a. The control circuit that is selected to operate in the test mode can be configured to generate a fake fault response for the fake fault input. Any functional input received by the first critical IP core 102a can be communicated, by the selection circuit 204, to the control circuit that is selected to operate in the functional mode. The control circuit (e.g., the first control circuit 202a or the second control circuit 202b) that is selected to operate in the functional mode can be configured to generate a functional response for the functional input.

When no fake fault input is received by the first critical IP core 102a (i.e., in an absence of a fake fault input), the selection circuit 204 can be configured to select both the first and second control circuits 202a and 202b to operate in the functional mode in lock-step. When both the first and second control circuits 202a and 202b are selected to operate in the functional mode simultaneously, the selection circuit 204 can be configured to communicate (or provide) any functional input received by the first critical IP core 102a to both the first and second control circuits 202a and 202b. In such a scenario, the first and second control circuits 202a and 202b are configured generate corresponding functional responses (e.g., first and second functional responses) for the functional input. If the first and second control circuits 202a and 202b are operating in lock-step, the first and second functional responses are same.

In other words, for ensuring availability of a control circuit for processing functional inputs, the selection circuit 204 can be configured to only select a single control circuit of the first and second control circuits 202a and 202b to operate in the test mode. Thus, at any given time-instance, at least one of the first and second control circuits 202a and 202b can be selected to operate in the functional mode to maintain availability of the first critical IP core 102a.

The monitor circuit 206 can be coupled with the first and second control circuits 202a and 202b, and the selection circuit 204. The monitor circuit 206 can include suitable logic and circuitry for detecting whether a fake fault response generated by a control circuit (e.g., the first or second control circuit 202a or 202b) is erroneous or error-free. In one embodiment, the monitor circuit 206 can be configured to store, therein, a look-up table. The look-up table may define, for each type of fake fault input that may be received by a control circuit, a fake fault response that is expected to be generated by the control circuit if the control circuit is error-free. In other words, the look-up table may define a set of fake fault inputs and a corresponding set of correct, expected fake fault responses. For example, if the first critical IP core 102a is a reset controller, the look-up table may indicate that for a first type of fake fault input (e.g., an event that warrants resetting of the SoC 100), a first fake fault response (e.g., a reset signal for the SoC 100) is expected to be generated. Similarly, the look-up table may indicate that for a second type of fake fault input (e.g., an event that does not warrant resetting of the SoC 100), a second fake fault response (e.g., no reset signal) is expected to be generated.

The monitor circuit 206 can be further configured to receive, from the selection circuit 204, any input (i.e., fake fault input or functional input) communicated (or provided) by the selection circuit 204 to any of the first and second control circuits 202a and 202b that is selected to operate in the test mode. For any fake fault input received by a control circuit (e.g., the first or second control circuit 202a or 202b) operating in the test mode, the monitor circuit 206 can be configured to compare a fake fault response generated by the control circuit with an expected fake fault response included in the look-up table. If the generated fake fault response matches (i.e., is same as) the expected fake fault response, the monitor circuit 206 can be configured to detect the generated fake fault response as error-free, indicating that the first critical IP core 102a is error free. However, if the generated fake fault response does not match the expected fake fault response, the monitor circuit 206 can be configured to detect the generated fake fault response as erroneous, indicating that the first critical IP core 102a is erroneous. In other words, the monitor circuit 206 can be configured to determine whether the first critical IP core 102a is erroneous, based on the detection of the generated fake fault response as error-free or erroneous. When the monitor circuit 206 detects that the generated fake fault response is erroneous, the monitor circuit 206 can be configured to generate a first error signal indicating that the first critical IP core 102a is determined to be erroneous (i.e., faulty).

When both the first and second control circuits 202a and 202b are selected to operate in the functional mode in lock-step, the monitor circuit 206 can be configured to detect a loss of lock-step between the first and second control circuits 202a and 202b. In other words, the monitor circuit 206 can be configured to determine whether the first and second control circuits 202a and 202b are operating in lock-step when the first and second control circuits 202a and 202b are operating in the functional mode simultaneously. The monitor circuit 206 may be configured to detect the loss of lock-step based on a comparison of a current state of the FSM implemented by each of the first and second control circuits 202a and 202b operating in the functional mode. If a current state of the FSM implemented by each of the first and second control circuits 202a and 202b is same, the monitor circuit 206 may detect that there is no loss of lock-step between the first and second control circuits 202a and 202b. However, if the current state of the FSM implemented by each of the first and second control circuits 202a and 202b is different, the monitor circuit 206 may detect that there is a loss of lock-step between the first and second control circuits 202a and 202b. In such a scenario, the monitor circuit 206 can be configured to generate a second error signal indicating the loss of lock-step between the first and second control circuits 202a and 202b. It will be apparent to those of ordinary skill in the art that the monitor circuit 206 may not check for loss of lock-step between the first and second control circuits 202a and 202b when one of the first and second control circuits 202a and 202b is operating in the test mode (i.e., when a fake fault input is received).

The signal control circuit 208 can be coupled with the first and second control circuits 202a and 202b, the selection circuit 204, and the monitor circuit 206. The signal control circuit 208 can be configured to output or mask the responses (e.g., fake fault responses or functional responses) generated by the first and second control circuits 202a and 202b. The signal control circuit 208 can be configured to mask, from the SoC 100, a fake fault response generated for a fake fault input by a control circuit (e.g., the first control circuit 202a or the second control circuit 202b) operating in the test mode. Similarly, the signal control circuit 208 can be configured to output (i.e., propagate), to the SoC 100, a functional response generated for a functional input by a control circuit (e.g., the first control circuit 202a and/or the second control circuit 202b) operating in the functional mode.

The signal control circuit 208 can be further configured to receive the first and second error signals from the monitor circuit 206. As described in the foregoing, the first error signal or the second error signal can be generated by the monitor circuit 206 when the monitor circuit 206 detects a fake fault response, generated by a control circuit (e.g., the first control circuit 202a or the second control circuit 202b) operating in the test mode, as erroneous or when the monitor circuit 206 detects a loss of lock-step between the first and second control circuits 202a and 202b that are operating in the functional mode simultaneously. Upon receiving an error signal (e.g., the first error signal or the second error signal), the signal control circuit 208 communicates the error signal to a safety control circuit (not shown) included in the SoC 100. The safety control circuit may be located outside the first critical IP core 102a or within the first critical IP core 102a without deviating from the scope of the disclosure. Based on the received error signal, the safety control circuit may issue a reset signal to the first critical IP core 102a for resetting the first critical IP core 102a. Based on the reset signal, the first critical IP core 102a undergoes one of a destructive reset (i.e., cold reset) or a functional reset (i.e., warm reset).

The register interface 210 can be coupled with the selection circuit 204, the first and second control circuits 202a and 202b, and the signal control circuit 208. The register interface 210 can include, therein, a set of configuration registers that can store a set of values to initialize each of the first and second control circuits 202a and 202b to operate in the test mode or the functional mode. When a control circuit (e.g., the first control circuit 202a or the second control circuit 202b) is selected to operate in the test mode or the functional mode, the control circuit may be initialized to operate in corresponding mode of operation, based on the set of values stored in the set of configuration registers.

The set of values in the set of configuration registers may further indicate which responses are to be masked and which responses are to outputted. For example, the set of values, stored in the set of configuration registers, may indicate that when the first and second control circuits 202a and 202b are operating in the test mode and the functional mode, respectively, a response (i.e., a fake fault response) of the first control circuit 202a is to be masked and a response (i.e., a functional response) of the second control circuit 202b is to be outputted. Similarly, the set of values may indicate that when the first and second control circuits 202a and 202b are operating in the functional mode and the test mode a response (i.e., a functional response) of the first control circuit 202a is to be outputted and a response (i.e., a fake fault response) of the second control circuit 202b is to be masked. Similarly, the set of values may indicate that when the first and second control circuits 202a and 202b are operating in the functional mode, a response (e.g., a first functional response) of the first control circuit 202a is to be masked and a response (e.g., a second functional response) of the second control circuit 202b is to be outputted. Alternatively, the set of values may indicate that when the first and second control circuits 202a and 202b are operating in the functional mode, a response (e.g., a first functional response) of the first control circuit 202a is to be outputted and a response (e.g., a second functional response) of the second control circuit 202b is to be masked.

The signal control circuit 208 can mask or output (i.e., propagates) the responses (i.e., fake fault responses or functional responses), based on the set of values stored in the set of configuration registers that are included in the register interface 210. For example, when the first and second control circuits 202a and 202b are selected to operate in the test mode and the functional mode, respectively, the monitor circuit 206 may read (i.e., retrieve) the set of values stored in the set of configuration registers. The set of values may indicate that when the first and second control circuits 202a and 202b are operating the test mode and the functional mode, respectively, any response generated by the first control circuit 202a is to be masked, while any response generated by the second control circuit 202b is to be outputted (i.e., propagated). Consequently, the monitor circuit 206 can communicate a masking request and a propagation request to the signal control circuit 208. The masking request may include a first identifier of the first control circuit 202a and indicate that any response (i.e., fake fault response) generated by the first control circuit 202a is to be masked from the SoC 100. Based on the masking request, the signal control circuit 208 can mask, from the SoC 100 (i.e., does not output) any response (i.e., the fake fault response) generated by the first control circuit 202a. The propagation request may include a second identifier of the second control circuit 202b and indicate that any response (i.e., functional response) generated by the second control circuit 202b is to be outputted (i.e., propagated). Based on the propagation request, the signal control circuit 208 can output (i.e., propagates to one or more components of the SoC 100) any response (i.e., the functional response) generated by the second control circuit 202b.

In another example, when the first and second control circuits 202a and 202b are operating in lock-step in the functional mode and generate the first and second functional responses for a functional input, the monitor circuit 206 can read (i.e., retrieve) the set of values stored in the set of configuration registers. The set of values may indicate that when both the first and second control circuits 202a and 202b are operating the functional mode, any response generated by the first control circuit 202a is to be masked, while any response generated by the second control circuit 202b is to be outputted (i.e., propagated). Consequently, the monitor circuit 206 can communicate a propagation request to the signal control circuit 208. In such a scenario, the propagation request can include the second identifier of the second control circuit 202b and can indicate that the signal control circuit 208 may propagate the second functional response generated by the second control circuit 202b. Based on the propagation request, the signal control circuit 208 can propagate the second functional response to the SoC 100. In another embodiment, the propagation request can include the first identifier of the first control circuit 202a and can indicate that the signal control circuit 208 may propagate the first functional response generated by the first control circuit 202a.

However, when the monitor circuit 206 detects a loss of lockstep between the first and second control circuits 202a and 202b operating in the functional mode, the monitor circuit 206 may communicate a masking request to the signal control circuit 208. In such a scenario, the masking request may include the first and second identifiers of the respective first and second control circuits 202a and 202b and indicate that the signal control circuit 208 mask the first and second functional responses. Based on the masking request, the signal control circuit 208 masks the first and second functional responses.

The register interface 210 can further include, therein, a set of status registers. The set of status registers can be configured to store, therein, a set of fake fault responses generated for a set of fake fault inputs by a control circuit, of the first and second control circuits 202a and 202b, operating (i.e., selected to operate) in the test mode. The set of status registers may also be configured to store, therein, a set of functional responses generated for a set of functional inputs by the first control circuit 202a and/or the second control circuit 202b, operating (i.e., selected to operate) in the functional mode. In an embodiment, the set of fake fault responses stored in the status registers may be used to generate diagnostic information pertaining to a functioning of the first critical IP core 102a. Further, in an embodiment, if the first critical IP core 102a undergoes a warm reset, data (fake fault responses previously generated by the first and/or second control circuits 202a and 202b) stored in the set of status registers may be retained post-reset. Upon reset, the first critical IP core 102a may again be subjected to testing to determine whether the first critical IP core 102a is erroneous or error-free.

The register interface 210 can be further configured to store, therein, any input (i.e., fake fault input or functional input) received by the first critical IP core 102a. In some scenarios, the look-up table may be stored in the register interface 210 and may be communicated to the monitor circuit 206 by the register interface 210, by way of the selection circuit 204.

The event capture and synchronizer circuit 212 can be coupled with the register interface 210 and can be configured to receive inputs for the first critical IP core 102a. In other words, the event capture and synchronizer circuit 212 can be configured to snoop the system bus 110 for fake fault inputs or functional inputs. Each of the received inputs may be one of a fake fault input or a functional input. The event capture and synchronizer circuit 212 can be configured to store the received inputs in the register interface 210. In other words, the event capture and synchronizer circuit 212 writes the received inputs to the register interface 210 so as to provide (i.e., communicate) the received inputs (e.g., fake fault inputs and functional inputs) to the first control circuit 202a and/or the second control circuit 202b, by way of the register interface 210 and the selection circuit 204. In some embodiments, when a received input (e.g., a fake fault input or a functional input) is stored in the register interface 210, the register interface 210 may communicate, to the monitor circuit 206, an interrupt signal indicating a fake fault input and/or a functional input is received by the first critical IP core 102a.

In operation, in an absence of any fake fault input, the selection circuit 204 can be configured to select the first and second control circuits 202a and 202b to operate in the functional mode. In one embodiment, the selection circuit 204 may read the register interface 210 to determine (i.e., detect) that there is no fake fault input stored in the register interface 210. Therefore, the selection circuit 204 determines that there is no fake fault input received by the first critical IP core 102a (i.e., fake fault input is absent). For selecting the first and second control circuits 202a and 202b to operate in the functional mode, the selection circuit 204 can be configured to communicate a first selection signal to each of the first and second control circuits 202a and 202b. The first selection signal may indicate that a corresponding control circuit (i.e., the first control circuit 202a or the second control circuit 202b) is to operate in the functional mode.

Based on the reception of the first selection signal, the first and second control circuits 202a and 202b can be configured to communicate first and second configuration requests to the register interface 210, respectively. The first and second configuration requests can be requests for retrieval of configuration data from the register interface 210 for the functional mode. Based on the first and second configuration requests, the register interface 210 communicates first and second configuration responses to the first and second control circuits 202a and 202b, respectively. The first and second configuration responses can include the set of values stored in the set of configuration registers of the register interface 210. Based on the first and second configuration responses, the first and second control circuits 202a and 202b are initialized to operate in the functional mode.

The event capture and synchronizer circuit 212 receives a functional input, i.e., snoops the functional input from the system bus 110. The functional input can be a real or actual input that can be processed by the first critical IP core 102a for performing one or more functions in the SoC 100. The event capture and synchronizer circuit 212 stores the received functional input in the register interface 210. The selection circuit 204 receives (i.e., retrieves or reads) the functional input stored in the register interface 210. Following the initialization of the first and second control circuits 202a and 202b to operate in the functional mode, the selection circuit 204 may communicate (i.e., provide) the functional input to the first and second control circuits 202a and 202b. While operating in the functional mode, the first and second control circuits 202a and 202b implement the FSM in lock-step and generate first and second functional responses, respectively, for the received functional input.

The first and second control circuits 202a and 202b communicate the respective first and second functional responses to the monitor circuit 206 and the signal control circuit 208. It can be expected that the first and second functional responses will be same since the first and second control circuits 202a and 202b are operating in lock-step. As described in the foregoing, if the monitor circuit 206 detects a loss of lock-step between the first and second (e.g., detection that the first and second functional responses are not the same), the monitor circuit 206 communicates the second error signal to the signal control circuit 208, resulting in the reset of the first critical IP core 102a. In a current embodiment, it can be assumed that no loss of lock-step is detected. Therefore, the monitor circuit 206 communicates a propagation request to the signal control circuit 208. The propagation request indicates that any of the first and second functional responses can be outputted to the SoC 100, since both the first and second functional responses are the same. Based on the propagation request, the signal control circuit 208 outputs one (e.g., the first functional response) of the first and second functional responses to the SoC 100. In an embodiment, the second functional response generated by the second control circuit 202b may be outputted (i.e., propagated or communicated) to the SoC 100. In such a scenario, the first functional response can be masked from the SoC 100 by the signal control circuit 208. The second functional response may be outputted to the first master controller 108, one of the set of non-critical IP cores 104, another critical IP core of the set of critical IP cores 102, or the like.

Figure 2B:
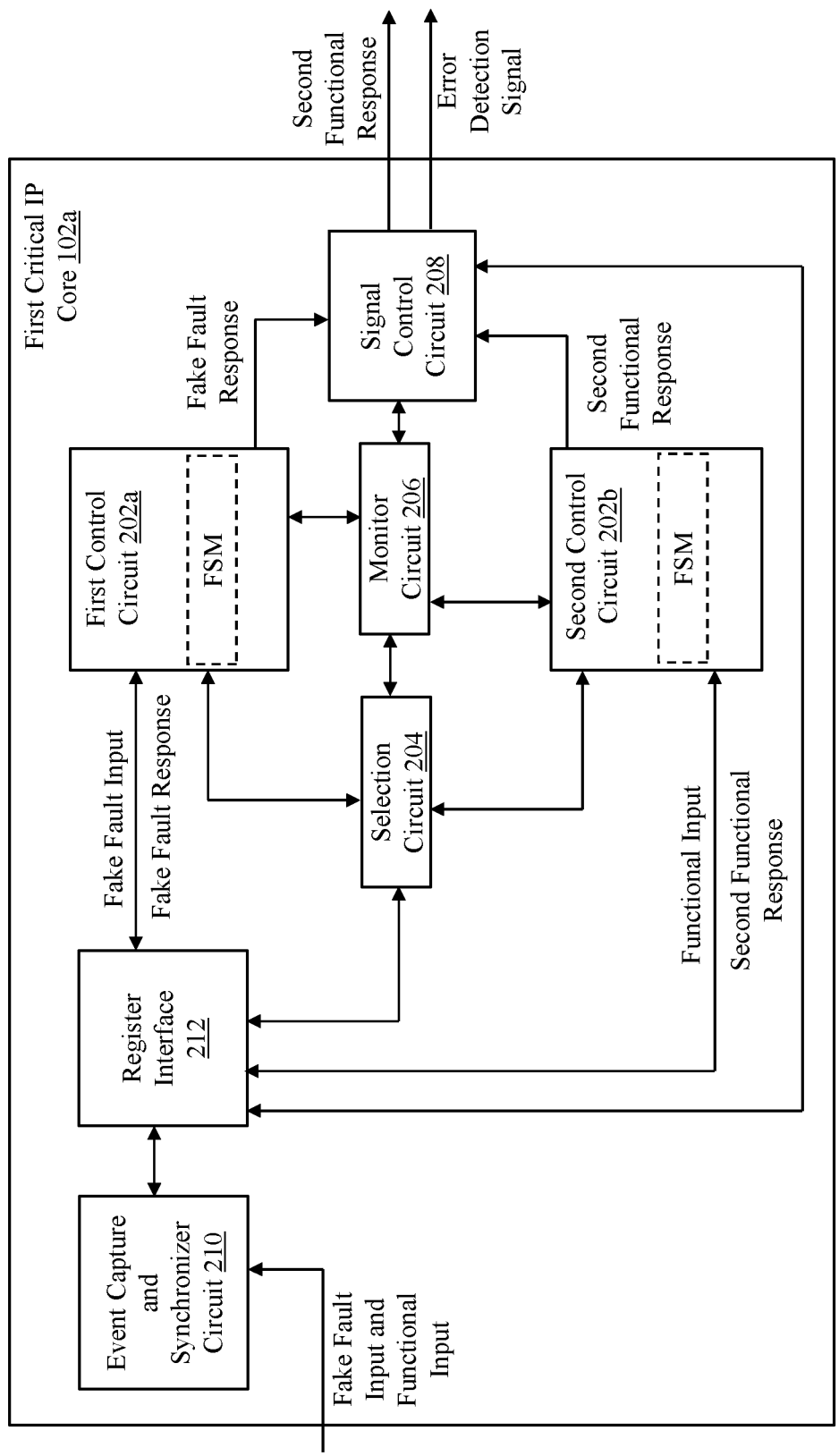
FIG. 2B is a block diagram that illustrates the first critical IP core, in accordance with another embodiment of the present disclosure.

FIG. 2B is a block diagram that illustrates a critical IP core of the set of critical IP cores 102, in accordance with another embodiment of the disclosure. The critical IP core illustrated in FIG. 2B can be any of the first through $n^{th}$ critical IP cores 102a-102n, without deviating from the scope of the disclosure. For the sake of brevity, the critical IP core illustrated in FIG. 2B can be assumed to be the first critical IP core 102a. FIG. 2B is explained in conjunction with FIG. 2A. FIG. 2B illustrates a scenario in which the first critical IP core 102a receives a fake fault input.

The event capture and synchronizer circuit 212 receives a fake fault input. In an embodiment, the fake fault input may be received from the first fault injection circuit 106a or the master controller 108. The event capture and synchronizer circuit 212 stores the received fake fault input in the register interface 210. The selection circuit 204 receives (i.e., retrieves or reads) the fake fault input stored in the register interface 210. In other words, the selection circuit 204 determines that the fake fault input is present.

In one embodiment, any input (i.e., a fake fault input or a functional input) may include an identifier (e.g., a set of bits) that indicates whether the input is a functional input or a fake fault input. Fake fault inputs may be distinguished from functional inputs based on the identifier included in each input (i.e., fake fault input or functional input).

Based on the determination that the fake fault input is present (i.e., in the presence of the fake fault input), the selection circuit 204 selects one of the first and second control circuits 202a and 202b to operate in the test mode. In other words, the selection circuit 204 can be configured to randomly switch one of the first and second control circuits 202a and 202b from the functional mode to the test mode. In an embodiment, the selection circuit 204 selects the first control circuit 202a to switch from the test mode to the functional mode. However, in another embodiment, the selection circuit 204 may select the second control circuit 202b to switch to the test mode from the functional mode. In a non-limiting example, it can be assumed that the selection circuit 204 selects the first control circuit 202a to switch from the test mode to the functional mode and the second control circuit 202b continues to operate in the functional mode.

Based on the switching of the first control circuit 202a from the test mode to the functional mode (i.e., based on the selection of the first control circuit 202a to operate in the test mode), the selection circuit 204 communicates a second selection signal to the first control circuit 202a. The second selection signal indicates that the first control circuit 202a is to operate in the test mode. Based on the second selection signal, the first control circuit 202a communicates a third configuration request to the register interface 210. The third configuration request can be a request for retrieval of configuration data, from the register interface 210, for operating in the test mode. Based on the third configuration request, the register interface 210 communicates a third configuration response to the first control circuit 202a. The third configuration response can include the set of values stored in the set of configuration registers. Based on the set of values included in the third configuration response, the first control circuit 202a can be initialized to operate in the test mode.

Following the initialization of the first control circuit 202a to operate in the test mode, the first control circuit 202a that is operating (i.e., selected to operate) in the test mode receives the fake fault input from the selection circuit 204. In other words, the event capture and synchronizer circuit 212 provides the fake fault input to the first control circuit 202a operating in the test mode, by way of the register interface 210 and the selection circuit 204. The first control circuit 202a processes the fake fault input. The first control circuit 202a generates a fake fault response for the fake fault input. In other words, the first control circuit 202a implementing the FSM in the test mode generates the fake fault response for the fake fault input. The first control circuit 202a communicates the fake fault response to the monitor circuit 206 and the signal control circuit 208. Further, the first control circuit 202a stores the fake fault response in the set of status registers.

While the first control circuit 202a is processing the fake fault input, if any new functional input is received by the first critical IP core 102a, the second control circuit 202b operating in the functional mode can be configured to process the new functional input to generate a corresponding functional response. In a non-limiting example, it can be assumed that a new functional input received by the first critical IP core 102a is same as the previously received functional input. Therefore, the new functional input can be referred to as "the functional input". The received functional input can be then stored in the register interface 210 by the event capture and synchronizer circuit 212. The received functional input that is stored in the register interface 210 can be retrieved by the selection circuit 204 and communicated (i.e., provided) to the second control circuit 202b that is operating in the functional mode. The second control circuit 202b generates a functional response (e.g., the second functional response) for the functional input. In other words, the second control circuit 202b implementing the FSM in the functional mode generates the second functional response for the functional input. The second control circuit 202b communicates the second functional response to the monitor circuit 206 and the signal control circuit 208.

It will be understood by those of skilled in the art that the first and second control circuits 202a and 202b may simultaneously (or parallelly) process the corresponding fake fault input and the functional input, thereby enabling testing of the first critical IP core 102a without compromising the availability of the first critical IP core 102a for handling real-time functional inputs.

The monitor circuit 206 receives the fake fault response and the second functional response from the first and second control circuits 202a and 202b, respectively. The monitor circuit 206 detects, based on information included in the look-up table, the fake fault response generated by the first control circuit 202a as one of erroneous or error-free. In other words, the monitor circuit 206 compares the generated fake fault response with an expected fake fault response included in the look-up table. If the generated fake fault response does not match the expected fake fault response, the monitor circuit 206 detects that the fake fault response as erroneous. In other words, the monitor circuit 206 determines the first critical IP core 102a as erroneous, based on the detection of the generated fake fault response as erroneous.

Based on the determination that the fake fault response as erroneous, the monitor circuit 206 communicates the first error signal to the signal control circuit 208. The first error signal indicates the detection of the generation fake fault response as erroneous and, thereby, the determination of the first critical IP core 102a as erroneous. The signal control circuit 208 communicates the first error signal to the safety control circuit. Based on the reception of the first error signal, the safety control circuit communicates a reset signal to the first critical IP core 102a, resetting the first critical IP core 102a.

However, if the generated fake fault response matches the expected fake fault response, the monitor circuit 206 detects the generated fake fault response as error-free. Based on the detection of the generated fake fault response as error-free, the first critical IP core 102a can be determined, by the monitor circuit 206, as error-free. Consequently, the monitor circuit 206 communicates a masking request and a propagation request to the signal control circuit 208. Based on the received masking request and the received propagation request, the signal control circuit 208 masks the fake fault response and outputs the second functional response.

If any more fake fault inputs are received by the first critical IP core 102a (by the event capture and synchronizer circuit 212), a similar process (as described above) may be followed for testing the first critical IP core 102a. In other words, the first control circuit 202a that is operating in the test mode continues to operate in the test mode and generates fake fault responses for the received fake fault inputs until all the fake fault inputs are handled. The second control circuit 202b that is operating in the functional mode continues to operate in the functional mode and generate functional responses for any functional inputs received by the first critical IP core 102a. If no new fake fault inputs are pending, the monitor circuit 206 determines whether the second control circuit 202b operating in the functional mode is in an idle state. In other words, the monitor circuit 206 determines whether the second control circuit 202b is currently processing any functional input. If the monitor circuit 206 determines that the second control circuit 202b is currently processing any functional input, the monitor circuit 206 may wait until the processing is complete and the second control circuit 202b reaches an idle state. When the second control circuit 202b reaches the idle state, the monitor circuit 206 communicates, to the selection circuit 204, a signal indicating the idle state of the second control circuit 202b. Based on the received signal, the selection circuit 204 switches the first control circuit 202a from the test mode to the functional mode. Based on the received signal, the selection circuit 204 selects the second control circuit 202b to operate in the functional mode. In other words, the selection circuit 204 selects the first and second control circuits 202a and 202b to operate in the functional mode simultaneously.

For the first and second control circuits 202a and 202b to operate in the functional mode, the selection circuit 204 communicates the first selection signal to the first and second control circuits 202a and 202b. As described in the foregoing, the first and second control circuits 202a and 202b are initialized to operate in the functional mode (i.e., implement the FSM in functional mode) simultaneously in lock-step. Any functional inputs received by the first critical IP core 102a may be processed by the first and second control circuits 202a and 202b that are operating in the functional mode in lock-step. When the first critical IP core 102a receives a fake fault input, one of the first and second control circuits 202a and 202b can again be switched to the test mode for testing.

In some embodiments, testing of each of the set of critical IP cores 102 may be initiated upon powering up of the SoC 100. Each of the set of critical IP cores 102 may be tested to ensure error-free operation of a corresponding critical IP core before testing (e.g., LBIST) of other components (e.g., the set of non-critical IP cores 104) on the SoC 100 can be initiated.

While FIGS. 2A and 2B are explained in regards to the first critical IP core 102a, it will be apparent to those of skill in the art that other critical IP cores, of the set of critical IP cores 102, may be structurally similar to the first critical IP core 102a for managing testing and availability simultaneously.

In some embodiments, no fake fault input may be received by the first critical IP core 102a. However, for testing the first critical IP core 102a, one of the first and second control circuits 202a and 202b may be selected to operate in the test mode and may be provided a fake fault input sampled from the functional input. In other words, the fake fault input provided (i.e., communicated) to the control circuit (i.e., the first control circuit 202a or the second control circuit 202b) that is selected to operate in the test mode can be same as the functional input received by the first critical IP core 102a.

FIGS. 3A-3D, collectively, represent a flow chart 300 that illustrates a method for managing testing and availability of the first critical IP core 102a, in accordance with an embodiment of the present disclosure.

Figure 3A:
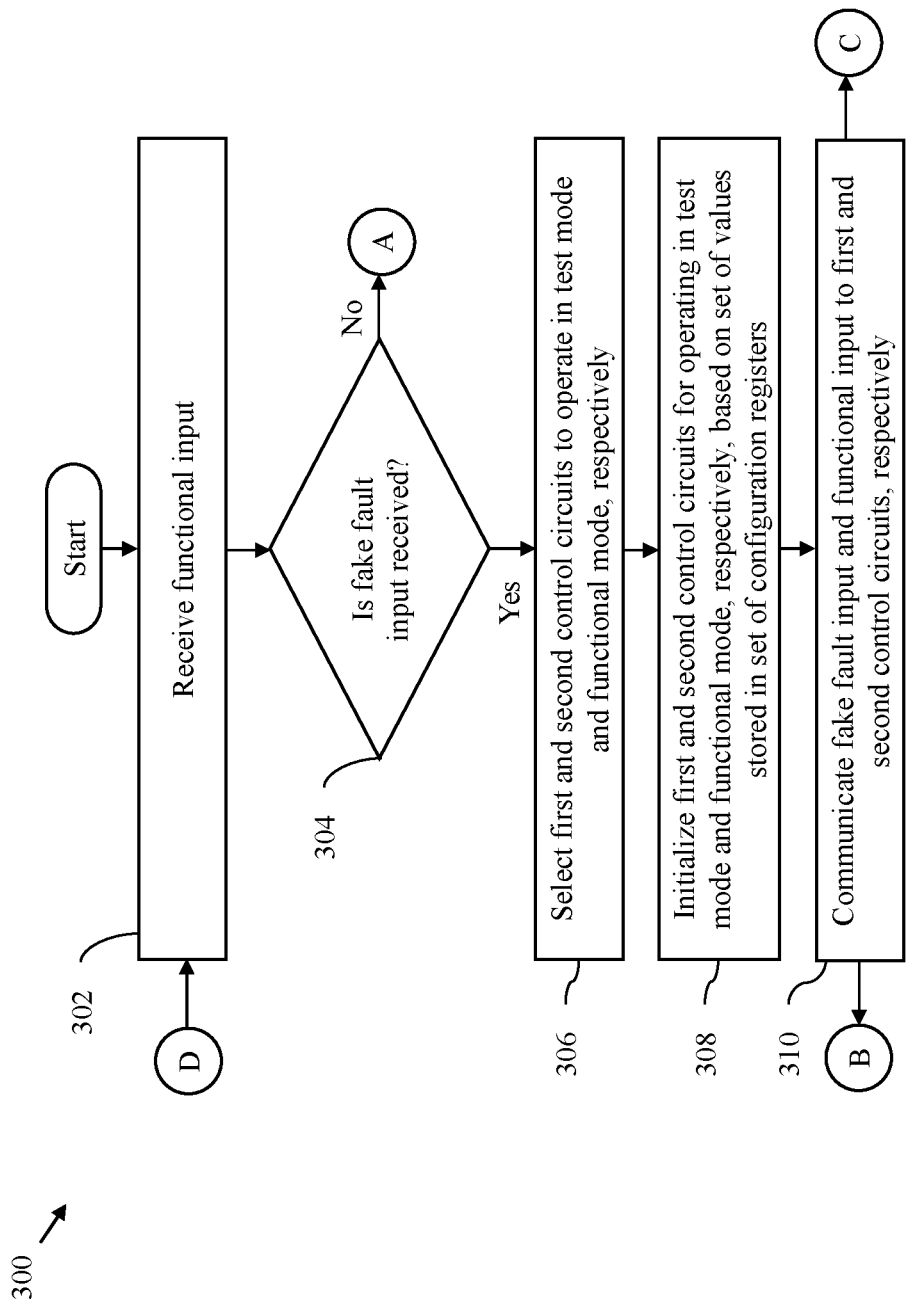

With reference to FIG. 3A, at step 302, the functional input can be received by the event capture and synchronizer circuit 212. The event capture and synchronizer circuit 212 stores the received functional input in the register interface 210. The selection circuit 204 retrieves (i.e., reads) the functional input from the register interface 210. At step 304, the selection circuit 204 determines whether a fake fault input is received by the first critical IP core 102a. In other words, the selection circuit 204 determines whether a fake fault input is present or absent. If at step 304, the selection circuit 204 determines that the fake fault input is received by the first critical IP core 102a (i.e., determined that a fake fault input is present), step 306 can be performed.

At step 306, the selection circuit 204 selects the first and second control circuits 202a and 202b to operate in the test mode and the functional mode, respectively. As described in the foregoing description of FIG. 2A, based on the selection of the first and second control circuits 202a and 202b to operate in the test mode and the functional mode, respectively, the selection circuit 204 communicates selection signals to the first and second control circuits 202a and 202b. For example, the selection circuit 204 communicates the first selection signal to the second control circuit 202b and the second selection signal to the first control circuit 202a. At step 308, the first and second control circuits 202a and 202b can be initialized for operating in the test mode and the functional mode, respectively, based on the set of values stored in the set of configuration registers. Process of initializing the first and second control circuits 202a and 202b for operating in the test mode and the functional mode is described in the foregoing description of FIG. 2B. At step 310, the selection circuit 204 communicates (i.e., provides) the fake fault input and the functional input to the first and second control circuits 202a and 202b that are selected to operate in the test mode and the functional mode, respectively, following the initialization of the first and second control circuits 202a and 202b.

Figure 3B:
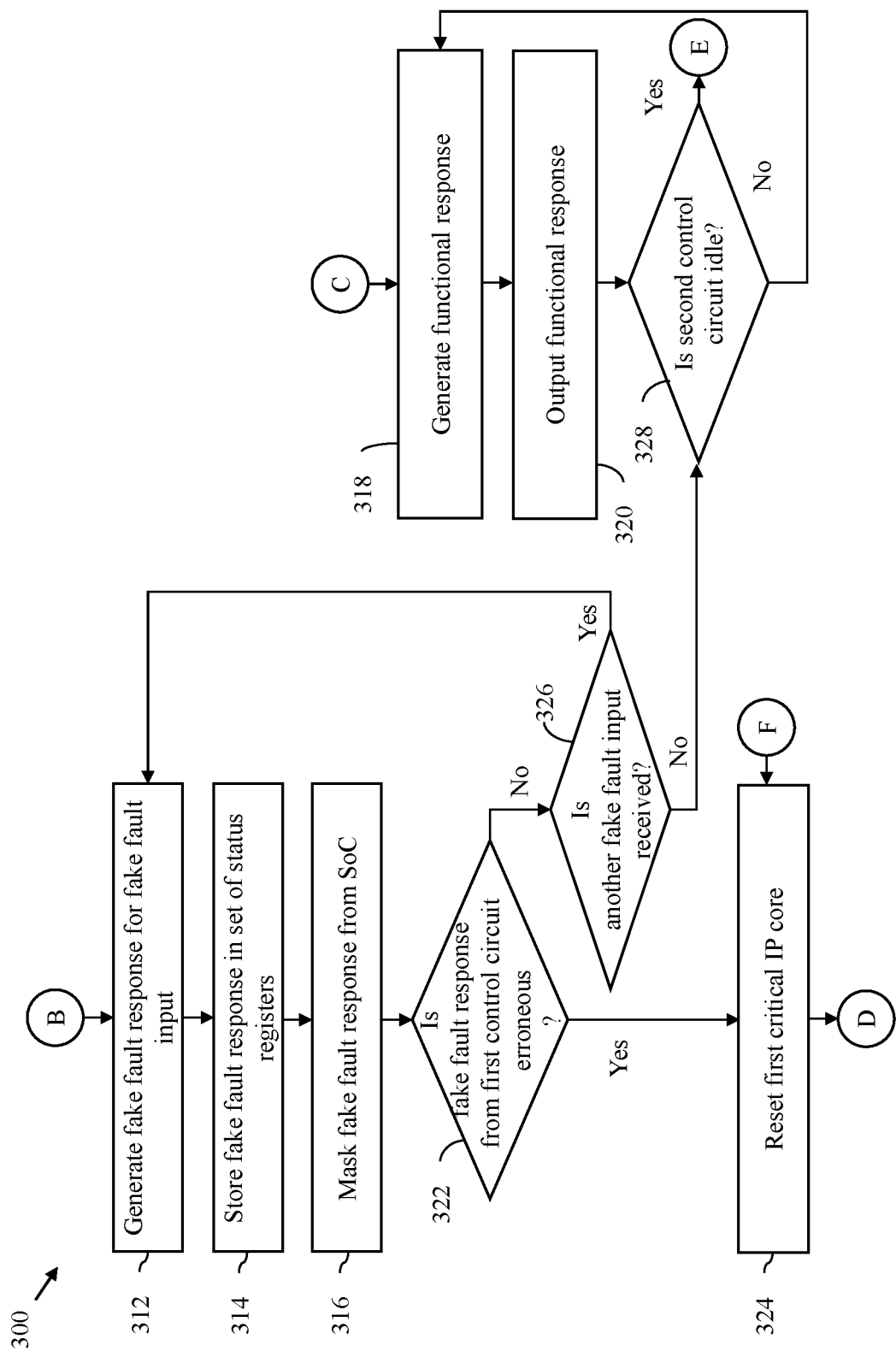

With reference to FIG. 3B, at step 312, the first control circuit 202a generates the fake fault response for the fake fault input. At step 314, the first control circuit 202a stores the generated fake fault response in the set of status registers included in the register interface 210. The first control circuit 202a further communicates the generated fake fault response to the monitor circuit 206 and the signal control circuit 208. At step 316, the signal control circuit 208 masks the generated fake fault response, based on a masking request received from the monitor circuit 206.

At step 318, the second control circuit 202b generates a functional response (e.g., the second functional response) for the functional input. The second control circuit 202b communicates (i.e., provides) the generated functional response to the monitor circuit 206 and the signal control circuit 208. At step 320, the signal control circuit 208 outputs the generated functional response, based on a propagation request received from the monitor circuit 206. In other words, the signal control circuit 208 may output the generated functional response (e.g., the second functional response) to the master controller 108 or any other circuit or component (e.g., a critical IP core, a non-critical IP core, or the like) on the SoC 100.

At step 322, based on the information stored in the look-up table, the monitor circuit 206 detects whether the fake fault response generated by the first control circuit 202*a* is erroneous. If at step 322, the generated fake fault response is detected as erroneous by the monitor circuit 206, step 324 can be performed. Based on the detection of the fake fault response as erroneous, the monitor circuit 206 communicates the first error signal to the safety control circuit, by way of the signal control circuit 208 (as described in the foregoing description of FIG. 2A). At step 324, the safety control circuit resets the first critical IP core 102*a* and step 302 can be performed. If at step 322, the generated fake fault response is not detected as erroneous (i.e., detected as error-free) by the monitor circuit 206, step 326 can be performed. At step 326, the selection circuit 204 determines, whether another fake fault is received by the first critical IP core 102*a* (based on whether any interrupt signal is received by the monitor circuit 206 from the register interface 210). If at step 326, the selection circuit 204 determines that another fake fault is received by the first critical IP core 102*a* (i.e., by the event capture and synchronizer circuit 212), step 312 can be performed. If at step 326, the selection circuit 204 determines that another fake fault is not received (i.e., no new fake fault input is received) by the first critical IP core 102*a*, step 328 can be performed. At step 328, the monitor circuit 206 determines whether the second control circuit 202*b* is in an idle state. In other words, the monitor circuit 206 determines whether the second control circuit 202*b* is currently processing any functional input or performing any other task. If at step 328, the monitor circuit 206 determines that the second control circuit 202*b* is not idle, step 318 can be performed. If at step 328, the monitor circuit 206 determines that the second control circuit 202*b* is in the idle state (i.e., the second control circuit 202*b* is not processing any functional input or performing any task), step 330 can be performed.

With reference to FIG. 3C, at step 330, the selection circuit 204 switches the first control circuit 202*a* from the test mode to the functional mode. In other words, the selection circuit 204 selects the first control circuit 202*a* to operate in the functional mode. The selection circuit 204 further selects the second control circuit 202*b* to operate in the functional mode. For switching the first control circuit 202*a* from the test mode to the functional mode, the selection circuit 204 communicates a selection signal (e.g., the second selection signal) to the first control circuit 202*a*. For selecting the second control circuit 202*b* to operate in the functional mode, the selection circuit 204 communicates a selection signal (e.g., the first selection signal) to the second control circuit 202*b*. At step 332, both the first and second control circuits 202*a* and 202*b* are initialized to operate in the functional mode simultaneously, based on the set of values stored in the set of configuration registers. Following the initialization, the first and second control circuits 202*a* and 202*b* operate in the functional mode in lock-step.

At step 334, the monitor circuit 206 detects whether there is a loss of lock-step between the first and second control circuits 202*a* and 202*b*. In other words, the monitor circuit 206 detects whether the first and second control circuits 202*a* and 202*b* are implementing the FSM in lock-step. If at step 334, the monitor circuit 206 detects that there is a loss of lock-step between the first and second control circuits 202*a* and 202*b*, step 324 can be performed. If at step 334, the monitor circuit 206 detects that there is no loss of lock-step between the first and second control circuits 202*a* and 202*b*, step 336 can be performed. At step 336, the register interface 210 determines/detects whether the first critical IP core 102*a* has received a power down instruction or command. If at step 336, the register interface 210 determines/detects that the event capture and synchronizer circuit 212 has received a power down instruction, step 338 can be performed. At step 338, the first critical IP core 102*a* can be powered down. After powering down, the first critical IP core 102*a* may be powered up again for receiving functional and/or fake fault inputs and generating corresponding functional responses and fake fault responses in a similar manner as described in the foregoing. If at step 336, the register interface 210 determines/detects that the first critical IP core 102*a* has not received any power down instruction, step 302 can be performed. In other words, the first and second control circuits 202*a* and 202*b* continue to operate in the functional mode in lock-step and generate functional responses for any new functional inputs received by the first critical IP core 102*a*, until a new fake fault is received by the first critical IP core 102*a* (i.e., by the event capture and synchronizer circuit 212).

Figure 3D:
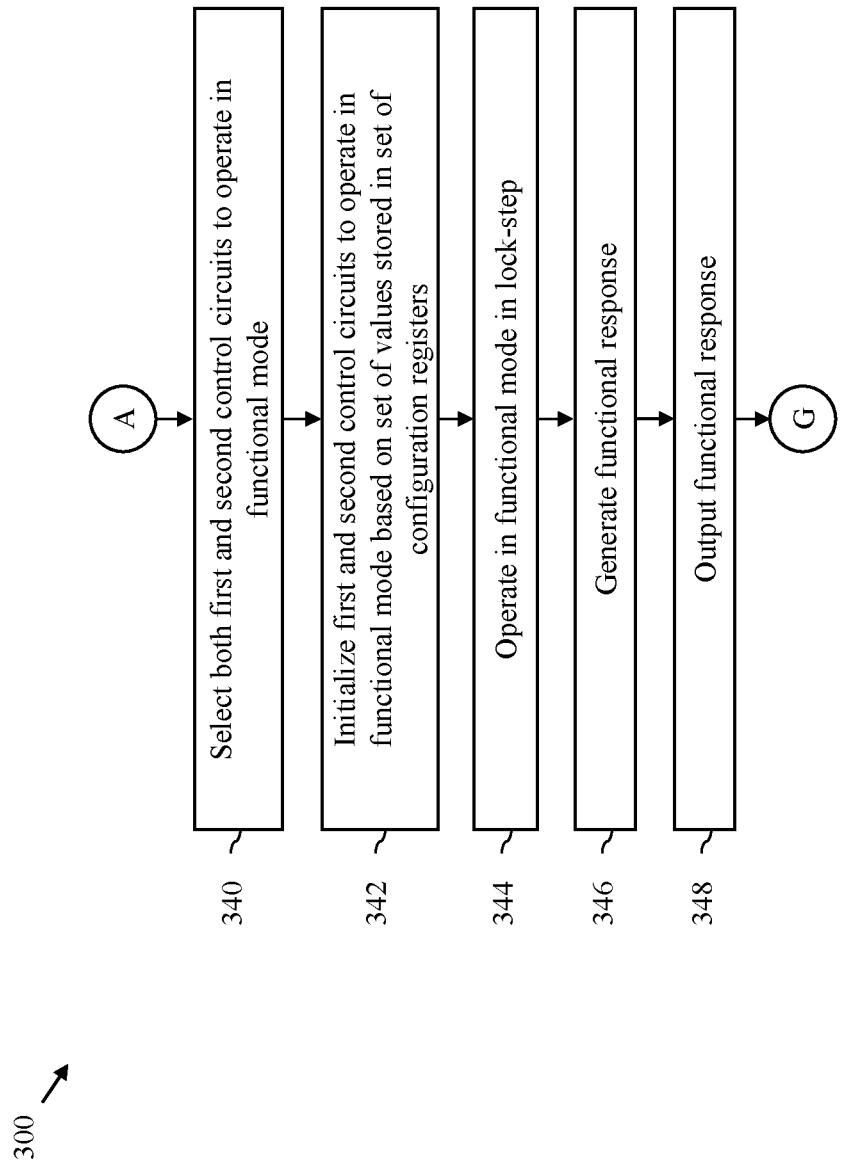

With reference to FIG. 3A, if at step 304, the selection circuit 204 determines that no fake fault input is received by the first critical IP core 102*a* (i.e., determined fake fault input is absent), step 340 can be performed. With reference to FIG. 3D, at step 340, the selection circuit 204 selects both the first and second control circuits 202*a* and 202*b* to operate in the functional mode. For selecting both the first and second control circuits 202*a* and 202*b* to operate in the functional mode, the selection circuit 204 communicates selection signals (e.g., the first selection signal) to the first and second control circuits 202*a* and 202*b*. At step 342, the first and second control circuits 202*a* and 202*b* are initialized to operate in the functional mode, based on the set of values stored in the set of configuration registers (as described in the foregoing description of FIG. 2A). At step 344, the first and second control circuits 202*a* and 202*b* operate in the functional mode in lock-step. The monitor circuit 206 may detect whether the first and second control circuits 202*a* and 202*b* are operating in lock-step and generate the second error signal if any loss of lock-step is detected. At step 346, the first and second control circuits 202*a* and 202*b* generate a functional response (e.g., the first and second functional responses) for the functional input. The first and second control circuits 202*a* and 202*b* communicate the first and second functional responses to the signal control circuit 208 and the monitor circuit 206. For the sake of brevity, it is assumed that first and second functional responses are the same. At step 348, the signal control circuit 208 outputs a functional response (i.e., one of the first and second functional responses), based on a propagation request received from the monitor circuit 206 and step 334 can be performed. Thus, the first and second control circuits 202*a* and 202*b* can continue to operate in the functional mode in lock-step and generate functional responses for received functional inputs, until a fake fault input is received or a loss of lock-step between the first and second control circuits 202*a* and 202*b* is detected by the monitor circuit 206.

Thus, the present disclosure describes management of testing and availability of critical IP cores (e.g., the set of critical IP cores 102) on the SoC 100. The first critical IP core 102a, as described in the disclosure, achieves optimal fault coverage and availability. Inclusion of the first and second control circuits 202a and 202b that implement the FSM in both the functional mode and the test mode ensures that the first critical IP core 102a can always be available to process any received fake fault input or functional input. Detection of a fake fault response as erroneous or detection of loss of lock-step between the first and second control circuits 202a and 202b operating in the functional mode can be followed by a reset of the first critical IP core 102a, enabling a quick and swift recovery of the first critical IP core 102a from any fake or actual safety event.

The selection circuit 204 enables hot-swapping (i.e., switching) of any of the first and second control circuits 202a and 202b from the functional mode to the test mode or vice-versa. This can ensure minimal delay in generation of fake fault responses and functional responses by the first and second control circuits 202a and 202b. Therefore, a fault coverage of the first critical IP core 102a can be improved without compromising on the availability (i.e., uninterrupted functioning) of the first critical IP core 102a. Further, since the first and second control circuits 202a and 202b generate the first and second functional responses for the functional input, when the first and second control circuits 202a and 202b are operating in the functional mode, safety, reliability, and robustness can be incorporated in an operation of the first critical IP core 102a through redundancy. Since there is no replication or duplication of the entire first critical IP core 102a, impact on a die size (i.e., physical footprint) of the SoC 100 may be negligible.

Further, the set of fault injection circuits 106 (e.g., the first fault injection circuit 106a), included in the SoC 100, enables generation of fake fault inputs for the set of critical IP cores 102. The set of fault injection circuits 106 may be configured to generate the fake fault inputs at any time instance (e.g., at pre-defined time-intervals, during a power-up of the SoC 100, or the like), providing a robust mechanism for testing the set of critical IP cores 102 and ensuring error-free operation of the set of critical IP cores 102. A combination of a fault injection mechanism (i.e., the set of fake fault injection circuits 106) and redundancy (i.e., the first and second control circuits 202a and 202b) enables critical IP cores (e.g., the set of critical IP cores 102) to continue functioning uninterrupted even when fake faults are injected into the critical IP cores for testing.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A system-on-chip (SoC), comprising:
a set of critical intellectual property (IP) cores configured to remain active for a built-in self-test of the SoC, wherein a first critical IP core of the set of critical IP cores comprises:
first and second control circuits, each operable in a test mode and a functional mode; and
a selection circuit coupled with the first and second control circuits, and configured to select each of the first and second control circuits to operate in one of the test mode and the functional mode,
wherein in an absence of a fake fault input, the selection circuit is configured to select the first and second control circuits to operate in the functional mode in lock-step,
wherein in a presence of the fake fault input, the selection circuit is configured to switch one of the first and second control circuits from the functional mode to the test mode,
wherein one of the first and second control circuits that is switched to the test mode is configured to receive the fake fault input and generate a fake fault response for the fake fault input, and
wherein the first critical IP core is determined as one of error-free and erroneous based on the generated fake fault response.

2. The SoC of claim 1, wherein when the first and second control circuits are selected to operate in the functional mode, the first and second control circuits are configured to receive a functional input and generate corresponding first and second functional responses for the functional input.

3. The SoC of claim 1, wherein when the first and second control circuits are selected to operate in the test mode and the functional mode, respectively, the second control circuit is configured to receive a functional input and generate a functional response for the functional input.

4. The SoC of claim 3, wherein the first critical IP core further comprises a signal control circuit coupled with the first and second control circuits, and configured to:
receive the fake fault response and the functional response from the first and second control circuits, respectively;
mask the fake fault response from the SoC; and
output the functional response.

5. The SoC of claim 3, wherein the first critical IP core further comprises an event capture and synchronizer circuit coupled with the first and second control circuits and the selection circuit, and configured to receive and provide the fake fault input and the functional input to the first and second control circuits, respectively, based on the selection of the first and second control circuits to operate in the test mode and the functional mode, respectively.

6. The SoC of claim 1, wherein the first critical IP core further comprises a monitor circuit coupled with the first and second control circuits and the selection circuit, and configured to detect the generated fake fault response as one of error-free and erroneous.

7. The SoC of claim 6, wherein the first critical IP core is configured to be reset based on the detection of the fake fault response as erroneous.

8. The SoC of claim 6, wherein the selection circuit is further configured to switch one of the first and second control circuits that is selected to operate in the test mode to the functional mode based on the detection of the generated fake fault response as error-free, and wherein the first critical IP core is determined as error-free based on the detection of the generated fake fault response as error-free.

9. The SoC of claim 6, wherein the monitor circuit is further configured to detect whether the first and second control circuits are operating in lock-step.

10. The SoC of claim 9, wherein the first critical IP core is configured to be reset, based on the detection of a loss of lock-step in the first and second control circuits.

11. The SoC of claim 1, wherein the first critical IP core further comprises a register interface coupled with the first and second control circuits and the selection circuit, and wherein the register interface comprises:
- a set of configuration registers configured to store a set of values to initialize each of the first and second control circuits to operate in the test mode and the functional mode; and
- a set of status registers configured to store the fake fault response generated by one of the first and second control circuits that is selected to operate in the test mode.

12. The SoC of claim 1, further comprising a fault injection circuit coupled with the first critical IP core, and configured to generate the fake fault input and provide the generated fake fault input to the first critical IP core to test the first critical IP core.

13. A method for facilitating testing of a critical intellectual property (IP) core in a system-on-chip (SoC), the method comprising:
- selecting, by a selection circuit of the critical IP core, first and second control circuits of the critical IP core to operate in a functional mode in an absence of a fake fault input, wherein each of the first and second control circuits are operable in a test mode and the functional mode;
- receiving, by an event capture and synchronizer circuit of the critical IP core, the fake fault input;
- switching, by the selection circuit, the first control circuit from the functional mode to the test mode based on the received fake fault input;
- generating, by the first control circuit operating in the test mode, a fake fault response for the fake fault input; and
- detecting, by a monitor circuit of the critical IP core, the generated fake fault response as one of error-free and erroneous, wherein the critical IP core is determined as one of error-free and erroneous based on the detection of the generated fake fault response as one of error-free and erroneous, respectively.

14. The method of claim 13, further comprising:
- receiving, by the event capture and synchronizer circuit, a functional input;
- communicating, by the event capture and synchronizer circuit, the functional input to the second control circuit that is selected to operate in the functional mode; and
- generating, by the second control circuit operating in the functional mode, a functional response for the functional input.

15. The method of claim 14, further comprising:
- masking, by a signal control circuit of the critical IP core, from the SoC, the generated fake fault response; and
- outputting, by the signal control circuit, the generated functional response.

16. The method of claim 13, wherein the critical IP core is reset based on the detection of the fake fault response as erroneous.

17. The method of claim 13, further comprising switching, by the selection circuit, the first control circuit from the test mode to the functional mode based on the detection of the generated fake fault response as error-free, wherein the first and second control circuits operate in lock-step when selected to operate in the functional mode simultaneously.

18. The method of claim 17, further comprising detecting, by the monitor circuit, whether the first and second control circuits are operating in lock-step.

19. The method of claim 18, wherein the critical IP core is reset, based on a detection of a loss of lock-step in the first and second control circuits.

20. The method of claim 13, further comprising:
- initializing, by a register interface of the critical IP core, the first and second control circuits to operate in the test mode and the functional mode, respectively, based on a set of values stored in a set of configuration registers of the register interface; and
- storing, by the first control circuit, the generated fake fault response in a set of status registers of the register interface.

* * * * *